United States Patent [19]

Abe et al.

[11] Patent Number: 4,811,260
[45] Date of Patent: Mar. 7, 1989

[54] SIGNAL PROCESSING CIRCUIT

[75] Inventors: Masato Abe, Sagamihara; Fumitaka Asami, Kunitachi, both of Japan

[73] Assignee: Fujitsu Limited, Kanagawa, Japan

[21] Appl. No.: 119,451

[22] Filed: Nov. 10, 1987

[30] Foreign Application Priority Data

Nov. 13, 1986 [JP] Japan .................. 61-270091
Nov. 13, 1986 [JP] Japan .................. 61-270092
Nov. 13, 1986 [JP] Japan .................. 61-270093
Nov. 13, 1986 [JP] Japan .................. 61-270094

[51] Int. Cl.$^4$ ............................................. G06F 7/38
[52] U.S. Cl. ............................ 364/724.01; 364/715.01
[58] Field of Search ..................... 364/715, 724, 768

[56] References Cited

U.S. PATENT DOCUMENTS

4,430,721 2/1984 Acampora ................. 364/724

Primary Examiner—Eugene R. Laroche
Assistant Examiner—David Mis
Attorney, Agent, or Firm—Armstrong, Nikaido, Marmelstein & Kubovcik

[57] ABSTRACT

A signal processing circuit comprises a constant value generating circuit for generating a constant value ($\alpha_i$) corresponding to a delay time ($d_i$) for an input signal ($V_i(t)$); an adding/subtracting circuit for alternately adding the constant value to the input signal and subtracting the constant value from the input signal for every half period of the input signal; and an amplitude correcting circuit for correcting an amplitude of an output signal of the adding/subtracting circuit for every half period of the input signal so that a delayed output signal ($V_o(t)$) having a waveform corresponding to a waveform of the input signal is produced.

16 Claims, 11 Drawing Sheets

SIGNAL PROCESSING CIRCUIT

BACKGROUND OF THE INVENTION

The present invention generally relates to signal processing circuits, and in particular to a signal processing circuit for delaying an input signal by a predetermined time. The present invention is applicable to filter circuits for an analog signal or a digital signal.

As well known, delay circuits are widely used as a signal processing circuit for delaying an input signal by a predetermined time. The delay circuits are generally classified into two types, one of which is an analog delay circuit and the other is a digital delay circuit. For example, ultrasonic delay lines such as a comb line filter are known as an analog delay circuit, and shift registers are known as a digital delay circuit. It is also well known that the delay circuits are used for filters for filtering an input signal to produce an output signal having desirable frequency components.

However, the conventional delay circuits using the ultrasonic delay lines have a disadvantage that the size is physically limited and therefore the delay circuits of the compact size are not obtainable.

On the other hand, the conventional delay circuits using the shift registers have a disadvantage that a number of shift registers to be connected in series increases as a delay amount (delay time) is increased. For this reason, the scales of the delay circuits become large as the delay amount of increases.

Moreover, when it is desired to eliminate some frequency components from the input signal, it is necessary to adjust the clock frequency or to vary the number of the shift registers forming the delay circuit 12. In other words, the frequency components to be eliminated are not changed even when the frequency of the input signal varies.

SUMMARY OF THE PRESENT INVENTION

Accordingly, a general object of the present invention is to provide a novel and useful signal processing circuit in which the disadvantages mentioned above have been eliminated.

A more specific object of the present invention is to provide a signal processing circuit having a circuit simpler than circuits of the conventional delay circuits.

Another object of the present invention is to provide a signal processing circuit capable of producing a signal having a delay amount which follow up a frequency of an input signal.

Still another object of the present invention is to provide a signal processing circuit having a filtering function obtainable by use of a delayed input signal.

A further object of the present invention is to provide a signal processing corcuit which may be suitably implemented by a semiconductor integrated circuit.

The foregoing objects of the present invention are accomplished by providing a signal processing circuit comprising a constant value generating circuit for generating a constant value ($a_i$) corresponding to a delay time ($d_i$) for an input signal ($V_i(t)$); an adding/subtracting circuit for alternately adding the constant value to the input signal and subtracting the constant value from the input signal for every half period of the input signal; and an amplitude correcting circuit for correcting an amplitude of an output signal of the adding/subtracting circuit for every half period of the input signal so that an output signal ($V_o(t)$) having a waveform corresponding to a waveform of the input signal is produced.

Other objects and further features of the present invention will become apparent from the following detailed description when read in conjunction with the attached drawings.

BRIEF DESCRIPTION OF THE DRAWINGS

FIG. 7(A) through (G) show waveforms at different parts of the circuit structure shown in FIG. 6;

FIG. 8(A) through (D) show waveforms for explaining a relationship between an input signal and both a delay amount and a period of the input signal;

FIG. 14(A) through (E) show waveforms at different parts of the configuration shown in FIG. 13;

DETAILED DESCRIPTION

A description will first be given on a conventional signal processing circuit including a delay circuit, for eliminating frequency components from an input signal.

Figure 1:
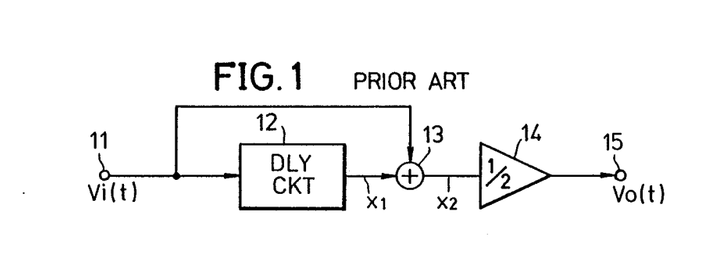
FIG. 1 is a block diagram of a conventional signal processing circuit having a signal filtering function.
Figure 2:
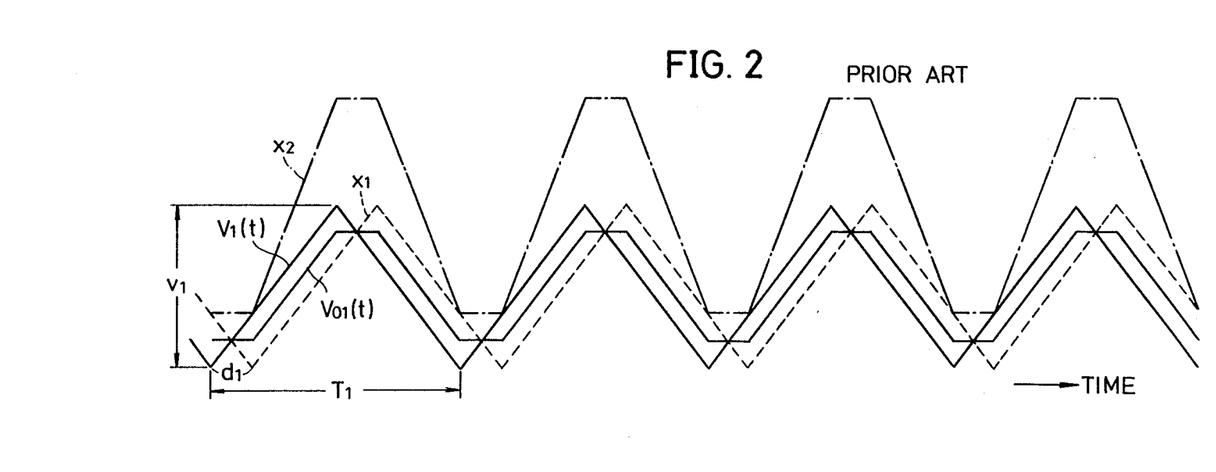
FIGS. 2 and 3 are respectively views showing waveforms at different parts of the configuration shown in FIG. 1.
Figure 3:
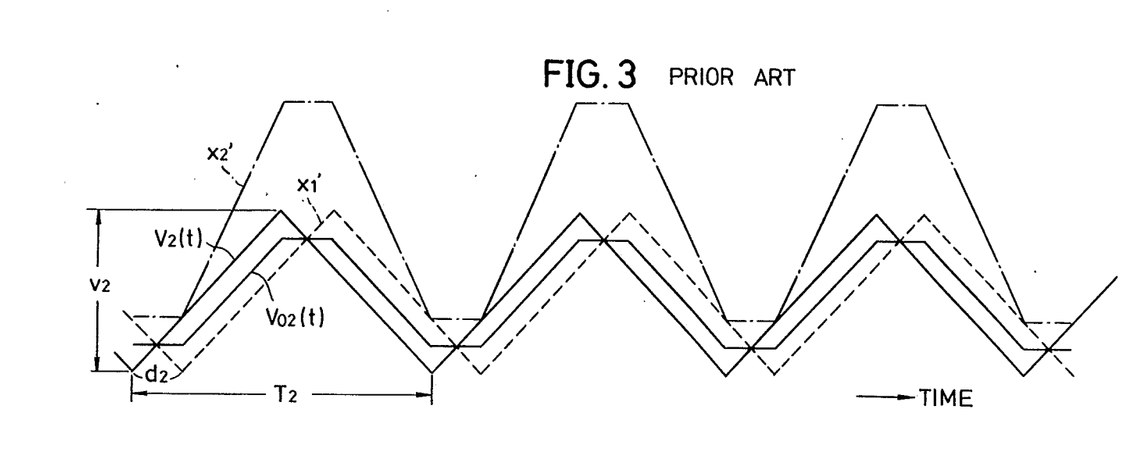

FIG. 1 is a block diagram of a conventional signal processing circuit including a delay circuit, for eliminating frequency components from an input signal, and FIGS. 2 and 3 are views showing waveforms at parts in the configuration shown in FIG. 1. Although the configuration shown in FIG. 1 is designed so as to process digital signals, an explanation below will be given with respect to analog signal waveforms corresponding to the digital signals to facilitate a better understanding.

Referring to FIGS. 1 and 2, an input signal $V_1(t)$ ($V_i(t)$; i=1) having a peak value $v_1$ and a period $T_1$ is applied to a delay circuit 12 through an input terminal 11. In this example, the input signal $V_1(t)$ is a triangular wave signal. The input signal $V_1(t)$ is delayed by a delay amount $d_1$ with respect to the original input signal $V_1(t)$ by the delay circuit 12, which is composed of shift registers. An output signal $x_1$ of the delay circuit 12 is fed to one input of an adder 13, the other input of which receives the input signal $V_1(t)$ through the terminal 11. An added result $x_2$ derived from the adder 13 is supplied to a ½ level attenuator 14, which attenuates a level of the signal $x_2$ by ½. An output signal $V_{o1}(t)$ from the attenuator 14 appears at an output terminal 15. As shown in FIG. 2, the output signal $V_{o1}(t)$ has flat signal parts. This means that some frequency components have been eliminated from the input signal $V_1(t)$.

FIG. 3 shows waveforms in a case where an input signal $V_2(t)$ which has a peak value $v_2$ (identical to the peak value $v_1$) and a period $T_2$ longer than the period $T_1$, is applied to the input terminal 11. The input signal $V_2(t)$ is delayed by a delay amount $d_2$, and is attenuated by ½ level, so that an output signal $V_{o2}(t)$ is produced.

It is now assumed that an input signal such as the signal $V_1(t)$ or $V_2(t)$ is generally represented by $V_i(t)$, and an output signal such as $V_{o1}(t)$ or $V_{o2}(t)$ is represented by $V_o(t)$, and a delay amount $d_i$ such as the delay amount $d_1$ or $d_2$ is represented by $d_i$. In this case, the output signal $V_o(t)$ can be expressed as follows:

$$V_o(t) = \tfrac{1}{2}[V_i(t-d_i) + V_i(t)] \quad (1).$$

It is further assumed that a delayed signal $V_i(t-d_i)$ in the equation (1) is expressed as the following equation (2):

$$V_i(t-d_i) = V_i(t) \pm \alpha_i \quad (2).$$

where $\alpha_i = 2v_i \cdot d_i / T_i$
Introducing the equation (2) into the equation (1),
$$V_o(t) = \tfrac{1}{2}[V_i(t) \pm \alpha_i + V_i(t)] = V_i(t) \pm C_i$$

where $C_i = (\tfrac{1}{2})\alpha_i$.
In the equation (2), $v_i$ is a peak value of the input signal $V_i(t)$ and $T_i$ is a period of the input signal $V_i(t)$.

However, the conventional signal processing circuit described in the foregoing has a disadvantage that the circuit scale of the delay circuit 12 is large, because the circuit 12 is formed by the multi-stage cascade connection of the shift registers formed by flip-flops, for example.

Figure 4:
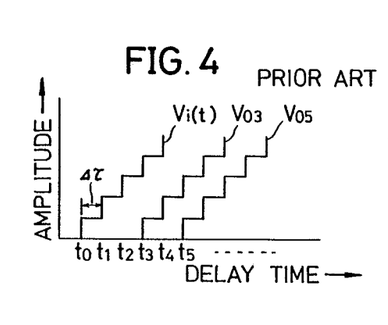
FIG. 4 is a graph for explaining a relationship between a number of shift registers forming a delay circuit and a delay time.

FIG. 4 shows an amplitude of the input signal $V_i(t)$ versus a delay time for explaining a relationship between a number of shift registers and a delay amount. According to this figure, a three-stage cascade connection of flip-flops each having a unit delay time $\Delta \tau$ is necessary to produce an output signal $V_{o3}$ having a delay amount $(t_3 - t_0)$ with respect to the input signal $V_i(t)$. Similarly, a five-stage cascade connection of flip-flops is necessary to produce an output signal $V_{o5}$ having a delay amount $(t_5 - t_0)$ with respect to the input signal $V_i(t)$.

Furthermore, the conventional signal processing circuit described above has the following disadvantage. A situation is considered in which the input signal $V_i(t)$ is delayed by a delay time which corresponds to a frequency of the input signal. For example, the input signal $V_1$ having a frequency of $1/T_1$ is delayed by the delay time $d_1$ as shown in FIG. 2, and the input signal $V_2(t)$ is delayed by the delay time $d_2$ having a frequency of $1/T_2$, as shown in FIG. 3. When it is intended to vary the delay time with respect to the input signal $V_i(t)$ in response to a variation in the frequency thereof in the conventional circuit structure, it is necessary to adjust a frequency of a clock signal supplied to the delay circuit 12 or to vary the number of stages of the cascade configuration. These adjustments are cumbersome.

The present invention mainly intends to eliminate these problems.

A description will now be given on an embodiment of a signal processing circuit according to the present invention with reference to FIGS. 5 and 6.

Figure 5:
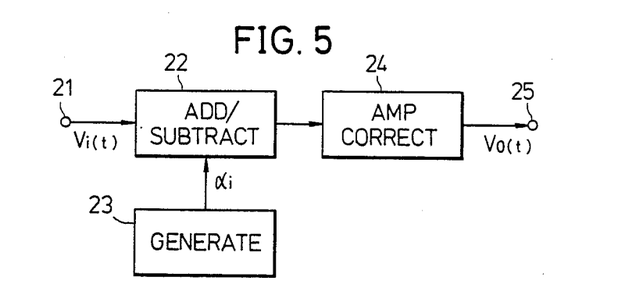
FIG. 5 is a block diagram of an embodiment of a signal processing circuit according to the present invention.

Referring to FIG. 5, an input signal $V_i(t)$ is passed through an input terminal 21 and applied to an adding-/subtracting circuit 22. A constant value generating circuit 23 generates a constant value $\alpha_i$ corresponding to a delay amount $d_i$ with respect to the input signal $V_i(t)$. The constant value $\alpha_i$ is supplied to the adding-/subtracting circuit 22. The adding/subtracting circuit 22 alternately carries out a subtracting operation of the constant value $\alpha_i$ from the input signal $V_i(t)$ and an adding operation of the constant value $\alpha_i$ to the input signal $V_i(t)$, for every period which is half of the period $T_i$ of the input signal $V_i(t)$. An output signal of the adding/subtracting circuit 22 is fed to an amplitude correcting circuit 24. The circuit 24 performs the amplitude correction for the output signal of the addition/subtraction circuit 24 for every ½ period of the input signal $V_i(t)$. An output signal $V_o(t)$ of the amplitude correcting circuit 24 is supplied to an external circuit through an output terminal 25.

Figure 6:
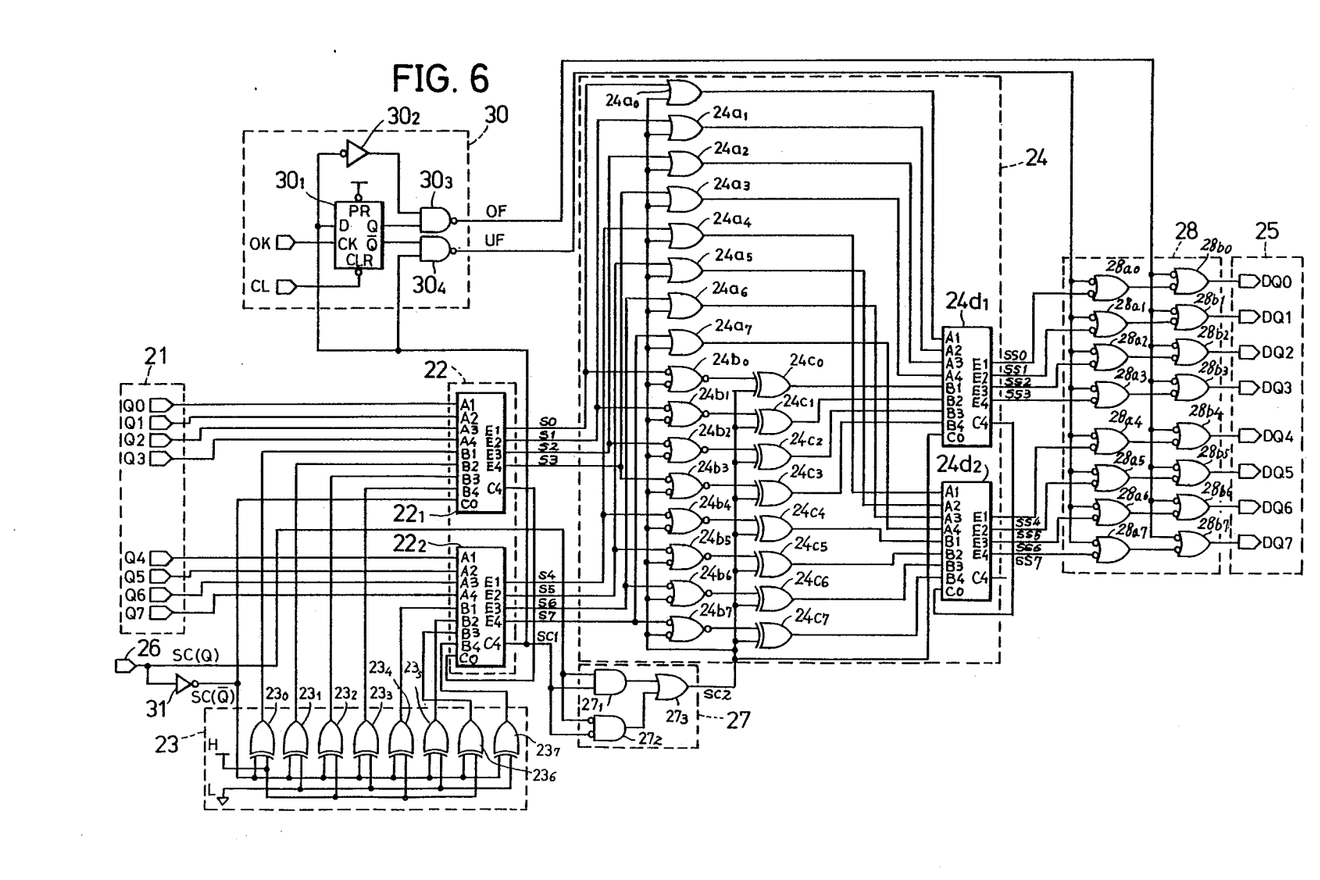
FIG. 6 is a circuit diagram of the block diagram shown in FIG. 5.
Figure 7:
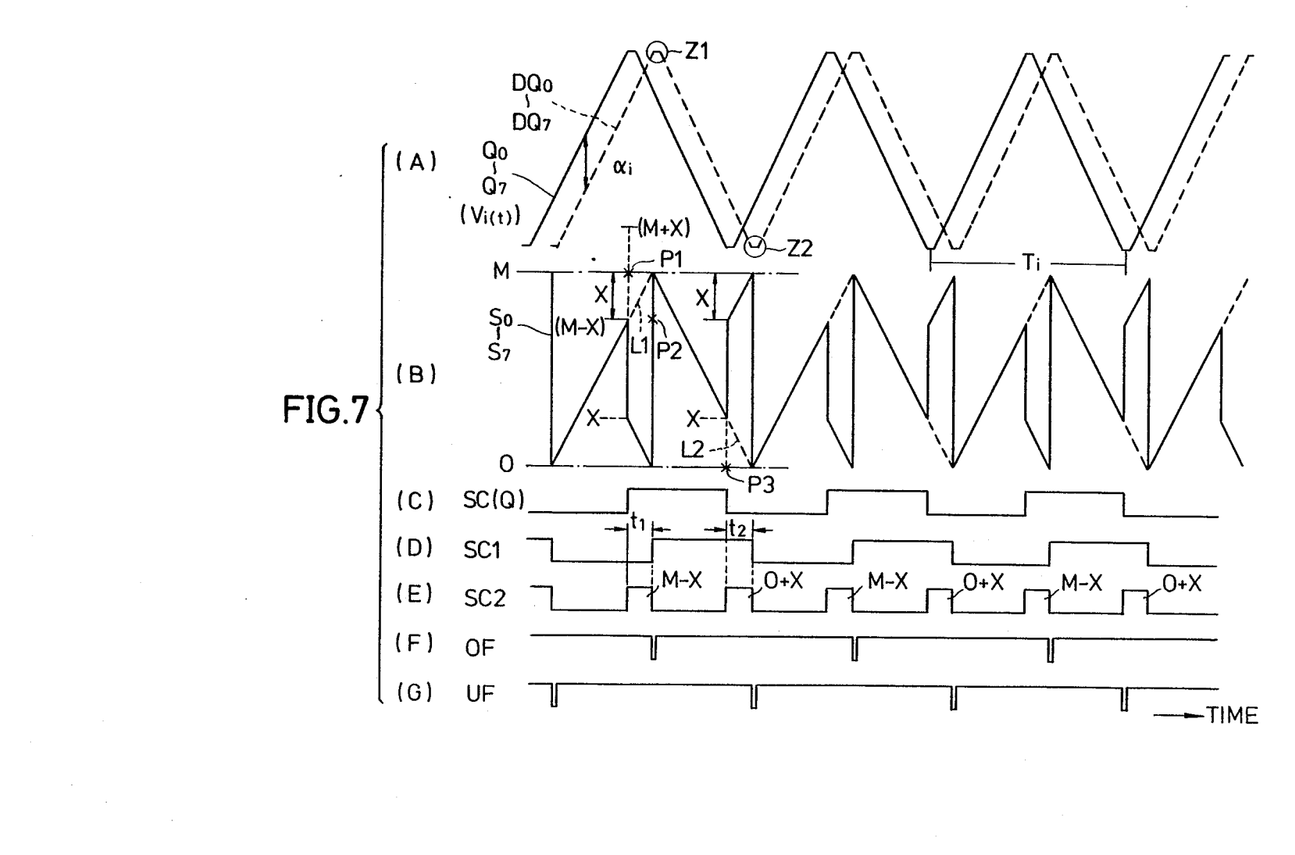

FIG. 6 is a circuit diagram of the block configuration shown in FIG. 5. FIG. 7(A) through (G) show waveforms of signals at different parts of the circuit configuration shown in FIG. 6. An illustrated circuit structure is designed so as to process the digital input signal $V_i(t)$ composed of 8 bits. However, it should be noted that in the following description, an explanation will be given by use of waveforms of analog signals corresponding to digital signals to facilitate a better understanding of the present embodiment.

The input signal $V_i(t)$ composed of 8 bits Q0, Q2, ... , and Q7 is applied to the adding/subtracting circuit 22 through the input terminal 21. In this embodiment, the input signal $V_i(t)$ has a triangular wave signal as shown in FIG. 7(A). The adding/subtracting circuit 22 also receives the constant value $\alpha_i$ composed of 8 bits which are produced by the constant value generating circuit 23.

The constant value generating circuit 23 consists of 8 exclusive-OR circuits $23_0, 23_1, \ldots, 23_7$. A high-level signal (H) or a low-level signal (L) is applied to each exclusive-OR circuit in accordance with the constant value $\alpha_i$ to be produced. The constant value generating circuit 23 produces the constant value $\alpha_i$ in response to a timing signal $SC(\overline{Q})$. The signal $SC(\overline{Q})$ is a signal obtained by inverting a carry signal $SC(Q)$ supplied from a terminal 26 by an inverter 31. The carry signal $SC(Q)$ has a period half of the period $T_i$ of the input signal $V_i(t)$, as shown in FIG. 7(C).

The adding/subtracting circuit 22 which alternately performs the adding operation and the subtracting operation, includes two 4-bit binary full adders $22_1$ and $22_2$. The adders $22_1$ and $22_2$ each have input terminals A1, A2, A3, and A4 and B1, B2, B3 and B4. The terminals A1, A2, A3 and A4 of the adder $22_1$ receive the input signals Q0, Q1, Q2 and Q3, respectively. The terminals A1, A2, A3 and A4 of the adder $22_2$ receive the input signals Q4, Q5, Q6 and Q7, respectively. The terminals B1, B2, B3 and B4 of the adder $22_1$ receive the outputs of the exclusive-OR circuits $23_0, 23_1, 23_2$ and $23_3$, respectively. The terminals B1, B2, B3 and B4 of the adder $22_2$ receive the outputs of the exclusive-OR circuits $23_4$, $23_5$, $23_6$ and $23_7$, respectively. The signal $SC(\overline{Q})$ from the inverter 31 is applied to a carry input terminal C0 of the adder $22_1$. The adders $22_1$ and $22_2$ carry out the adding operation or the subtracting operation in accordance with timings defined by the signal SC(Q). In detail, when the signal SC(Q) is kept low, the adders $22_1$ and $22_2$ carry out the subtracting operation, whereas when the signal SC(Q) is kept high, the adders $22_1$ and $22_2$ carry out the adding operation. An added or subtracted result S0 between A1 and B1 of the adder $22_1$ appears at a terminal E1 thereof. Likewise, calculated results S1, S2 and S3 between A2 and B2; A3 and B3; and A4 and B4 of the adder $22_1$ appear at terminals E2, E3 and E4 thereof, respectively. Similarly, calculated results S4, S5, S6 and S7 are obtained at terminals E1, E2, E3 and E4 of the adder $22_2$, respectively. A carry output C4 of the adder $22_1$ is fed to a carry input C0 of the adder $22_2$.

An analog output signal corresponding to the binary signals S0-S7 is shown by a solid line in FIG. 7(B). When the signal $SC(\overline{Q})$ is maintained in the low level, or the signal SC(Q) is in the high level, the adding/subtracting circuit 22 subtracts are constant value $a_i$ from the input signal $V_i(t)$. The level of the binary signals S0-S7 linearly increase towards a maximum level M thereof. When the signal SC(Q) is changed from the low level into the high level, the adding/subtracting circuit 22 is switched into the adding operation. In a state just prior to this level change, the output signal S0-S7 of the adding/subtracting circuit 22 has a value (M−x). On the other hand, the input signal $V_i(t)$ composed of the binary signals Q0-Q7 is positioned at P1, for example (in this case, the constant value $a_i$ is equal to the value x). That is, the input signal $V_i(t)$ has the maximum value M, in which all of the bits Q0-Q7 have 1s (255 is the decimal notation). In a state where the signal SC(Q) is at the high level, the adding/subtracting circuit 22 adds the constant value $a_i$ to the input signal $V_i(t)$. Therefore, an added result obtained just when the signal SC(Q) is changed into the high level becomes equal to (M+x). However, since the output of the adding/subtracting circuit 22 is limited to 8 bits (0 to 255 in the decimal notation), it cannot output a value exceeding the maximum value M. Actually, at this time, the combination of the adders $22_1$ and $22_2$ outputs a value equal to the level x, in which the carry is outputted at the terminal C4 of the adder $22_2$. Therefore, as shown in FIG. 7(B), when the signal SC(Q) is changed from the low level into the high level, the output of the adding/subtracting circuit 22 is correspondingly changed from the level (M−x) into the level x. Thereafter, the output of the circuit 22 linearly decreases towards a minimum level O, in which all of the bits S0-S7 are 0s (0 in the decimal notation).

When the output level of the adder 22 becomes zero, the input signal $v_i(t)$ is positioned at P2 at which the level of the input signal $V_i(t)$ is equal to (M−x), as shown in FIG. 7(B). Then, the circuit 22 adds the constant value $a_i$ to the level (M−x). Therefore, as shown in FIG. 7(B), the level of the output of the adder 22 is changed from the minimum level O into the maximum level M. Then the level of the output of the adder 22 linearly decreases.

Thereafter, when the signal SC(Q) is changed from the high level into the low level, the circuit 22 is correspondingly switched from the adding operation into the subtracting operation. At this time, the input signal $V_i(t)$ is positioned at P3. Therefore, the circuit 22 subtracts the constant value $a_i$ from the minimum level, and thus outputs a level equal to (M−x). In the way described above, the circuit 22 alternately carries out the adding operation and the subtracting operation for every half period of the period $T_i$ of the input signal.

As described in the foregoing, the signal waveform corresponding to the signals S0-S7 is intentionally destorted corresponding to the constant value $a_i$ which corresponds to the predetermined delay time.

Returning to FIG. 6, a timing signal generating circuit 27 produces a timing signal SC2 to be fed to the amplitude correcting circuit 24. The circuit 27 is made up of an AND circuit $27_1$, a low-active NAND (a high-active NOR) circuit $27_2$ and an OR circuit $27_3$. The circuit 27 receives a signal SC1 outputted by the adding/subtracting circuit 22. As shown in FIG. 7(D), the signal SC1 has a timing corresponding to the delay amount. The timing signal generating circuit 27 also receives the signal SC(Q) through the terminal 26. The circuit 27 generates the timing signal SC2 as shown in FIG. 7(E).

The output signals S0-S7 shown in FIG. 7(B) and the timing signal SC2 shown in FIG. 7(E) are supplied to the amplitude correcting circuit 24. This circuit 24 carries out logical calculation for the signals S0-S7 in accordance with the timing of the signal SC2. That is, the signals S0-S7 are passed through the circuit 24 during a period when the timing signal SC2 is at the low level. On the other hand, during a high-level interval $t_1$, the amplitude correcting circuit 24 outputs a signal having a value (M−x) indicated by a broken line L1, as shown in FIG. 7(B). Further, during a next high-level period $t_2$, the amplitude correcting circuit 24 outputs a signal having a vlaue (0+x) indicated by a broken line L2.

The amplitude correcting circuit 24 includes 8 OR circuits $24a_0$-$24a_7$, 8 low-active (8 high-active AND) OR circuits $24b_0$-$24b_7$ and 8 exclusive-OR circuits $24c_0$-$24c_7$. Input terminals of the OR circuits $24a_0$-$24a_7$ and $24b_0$-$24b_7$ receive the signals S0-S7 from the adding/subtracting circuit 22, and the other terminals thereof receive the timing signal SC2. Output terminals of the OR circuits $24b_0$-$24b_7$ are connected to inputs of the exclusive-OR $24c_0$-$24c_7$, respectively. The other input terminals of the exclusive-OR $24c_0$-$24c_7$ receive the timing signal SC2. Outputs of the OR circuits $24a_0$-$24a_3$ are fed to input terminals A1-A4 of a 4-bit binary full adder $24d_1$ (74-283 type, for example), respectively. Outputs of the exclusive-OR circuits $24c_0$-$24c_3$ are supplied to input terminals B1-B4 of the adder $24d_1$, respectively. Outputs of the OR circuits $24a_4$-$24a_7$ are fed to input terminals A1-A4 of an 4-bit binary full adder $24d_2$ (74-283 type, for example), respectively. Outputs of the exclusive-OR circuits $24c_4$-$24c_7$ are supplied to input terminals B1-B4 of the adder $24d_2$, respectively.

When the signal SC2 is at the low level, all the outputs of the OR circuits $24b_0$-$24b_7$ are 0s (at the low level). Therefore, the outputs of the exclusive-OR circuits $24c_0$-$24c_7$ are all 1s (at the high level). Since all the OR circuits $24a_0$-$24a_7$ receive the signal SC2 maintained at the high level, the signals S0-S7 are passed through the OR circuits $24a_0$-$24a_7$ and fed to the corresponding input terminals of the adders $24d_1$ and $24d_2$. The adders $24d_1$ and $24d_2$ can perform the adding operation, because the carry input terminals C0 thereof receive the signal SC2 maintained at the high level. Consequently, output signals SS0-SS7 appearing at output terminals E1–E4 of the adders $24d_1$ and $24d_2$ coincide with the signals S0–S7, respectively.

During the interval $t_1$, since the timing signal SC2 is maintained at the high level, all the outputs of the OR circuits $24a_0$–$24a_7$ are kept at the high level. That is, the value of 255 in the decimal notation are supplied to the combination of the adders $24d_1$ and $24d_2$. Since the OR circuits $24b_0$–$24b_7$ all receive the high level, the signals S0–S7 are passed therethrough and are fed to the exclusive-OR circuits $24c_0$–$24c_7$, respectively. The signals S0–S7 from the OR circuits $24b_0$–$24b_7$ are inverted by the exclusive-OR circuits $24c_0$–$24c_7$, respectively and supplied to the corresponding input terminals of the adders $24d_1$ and $24d_2$. During the interval $t_1$, the adders $24d_1$ and $24d_2$ may carry out the subtracting operation, because they receive the signal SC2 maintained at the low level. Thus, the adders $24d_1$ and $24d_2$ output the signals SS0–SS7 corresponding to the signal L1 shown in FIG. 7(B).

During the interval $t_2$ which follows the interval $t_1$, the amplitude correcting circuit 24 operates in the similar way to that during the interval $t_1$.

The signals SS0–SS7 are supplied to an amplitude adjusting circuit 28. Although the circuit 28 is not employed in the configuration shown in FIG. 5, it is actually preferable to use this circuit. This circuit 28 adjusts amplitudes at the maximum and minimum levels thereof in response to an adjusting signal OF as shown in FIG. 7(F) and an adjusting signal UF as shown in FIG. 7(G). The level of the signal OF becomes low in response to the leading edge of the signal SC1. The level of the signal UF becomes low in response to the trailing edge of the signal SC1. The signals OF and UF are produced by a adjusting signal generating circuit 30. The circuit 30 includes a D-type flip-flop $30_1$, an inverter $30_2$, and NAND circuits $30_3$ and $30_4$, as shown in FIG. 6. A clock signal CK and a clear signal are supplied to a clock terminal and a clear terminal of the flip-flop $30_1$, respectively. A D-terminal of the flip-flop $30_1$ is connected to the carry input terminal C0 of the adder $22_2$. Q and $\overline{Q}$ terminals of the flip-flop $30_1$ are connected to the NAND circuits $30_3$ and $30_4$, respectively. The other input terminals of the circuits $30_3$ and $30_4$ are connected to an output terminal of the inverter $30_2$ and the D-terminal of the flip-flop $30_1$, respectively. An input terminal of the inverter $30_2$ is also connected to the D-terminal.

The amplitude adjusting circuit 28 consists of low-active (high-active NAND) OR circuits $28a_0$–$28a_7$ which receive the signal UF, and low-active OR circuits $28b_0$–$28b_7$ which receive the signal OF. The signals SS0–SS7 are fed to the OR circuits $28a_0$–$28a_7$, respectively. When the signal UF is changed from the high level into the low level, all the outputs of the OR circuits $28a_0$–$28a_7$ become high. At this time, since the signal OF are maintained at the high level, all the OR circuits $28b_0$–$28b_7$ become low. As a result, the level of the minimum value of the signal composed of the signals SS0–SS7 is set to 0s, so that the undesirable level variation at the minimum level can be eliminated.

On the other hand, when the signal OF is at the low level, all the signals UF are at the high level. Therefore, the level of the maximum vale of the signal composed of the signals SS0–SS7 is set to 255 in the decimal notation, so that the undesirable level variation at the maximum level can be eliminated.

As a result, delay signals DQ0–DQ7 corresponding to a broken line in FIG. 7(A) are outputted through the output terminal 25. The maximum and minimum values of the signals DQ0–DQ7 are set to 255 and 0 in the decimal notation, as shown by Z1 and Z2 in FIG. 7(A), respectively.

As clearly shown from the above description, the present invention makes it possible to produce a delayed signal without using the ultrasonic delay line or the shift registers.

Figure 8:
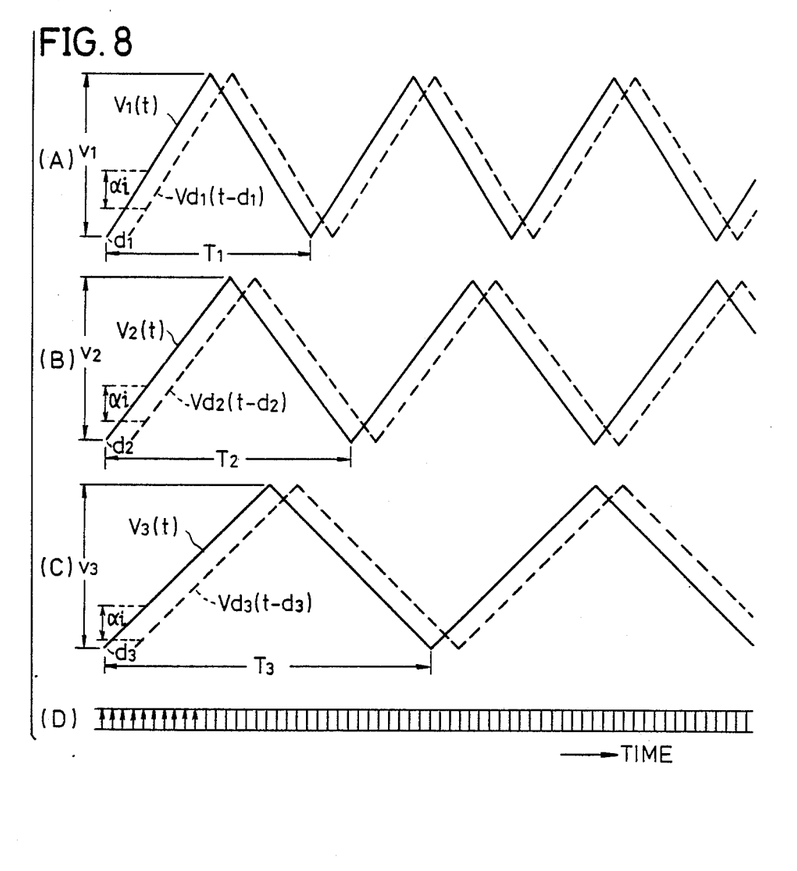

A description will be given of a relationship between the input signal $v_i(t)$ and both its period and the delay amount, with reference to FIGS. 8(A) through 8(D).

FIG. 8(A) through (C) show three different input signals $V_1(t)$, $V_2(t)$ and $V_3(t)$, respectively. FIG. 8(D) shows sampling timings provided by the clock signal CK. For these figures, the following equation may be expressed:

$$Vd_1(t-d_i)=V_i(t)-[\pm v_i/(T_i/2)]d_i=V_i(t)\pm 2\cdot v_i\cdot(d_i/T_i) \quad (3)$$

where $Vd_1(t)$ is an output signal after delaying operation. As described before, $V_i(t)$ is the input signal, $T_i$ is the period of the input signal, $v_i$ is the peak value of the input signal, and $d_i$ is the delay time. When it is assumed that $$2\cdot v_i\cdot(d_i/T_i)=\alpha_i \quad (4)$$

the following relationship can be obtained:

$$Vd_1(t-d_i)=V_i(t)\pm \alpha_i \quad (5)$$

where $\alpha_i$ is the constant value mentioned above, which is a value to be added to the input signal or to be subtracted from the input signal in the adding/subtracting circuit 22.

It is now assumed that the period $T_1$ of the input signal $V_1(t)$ shown in FIG. 8(A) is changed into the period $T_2$ shown in FIG. 8(B) or the period $T_3$ shown in FIG. 8(C). Since both the constant value $\alpha_i$ and the peak value $v_i$ are constant, the above equation (4) shows that the delay time $d_i$ varies in proportion to the period $T_i$. Hence, the present invention can produce the output signal $Vd_i$ having the delay time $d_i$ corresponding to the period $T_i$ of the input signal. As clearly shown in FIGS. 8(A) through 8(C), the delay times $d_2$ and $d_3$ of the output signals $Vd_2(t-d_2)$ and $Vd_3(t-d_3)$ varies in response to the variation of the frequency (or the period) of the input signal. It should be appreciated that the delay time corresponding to the frequency of the input signal can be automatically obtained.

Figure 9:
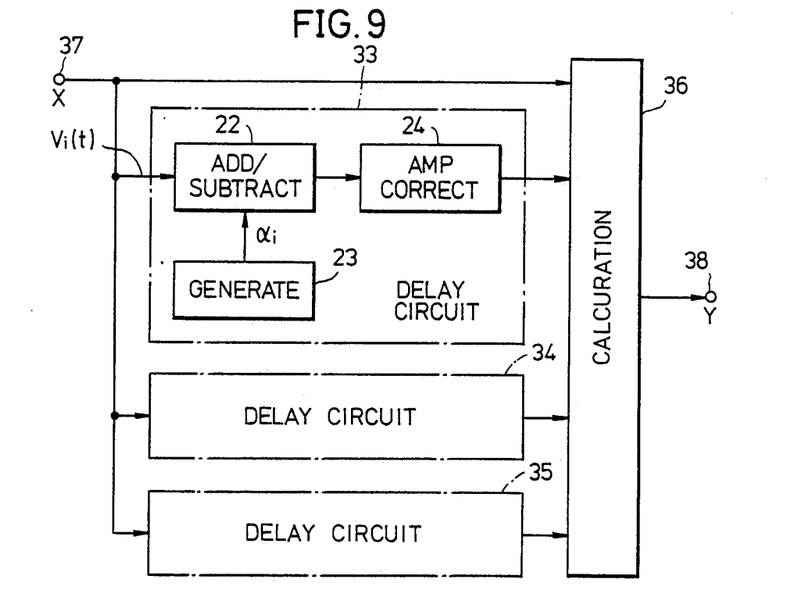
FIG. 9 is a block diagram of a filter which employs delay circuits each having the same structure as that shown in FIGS. 5 and 6.
Figure 11:
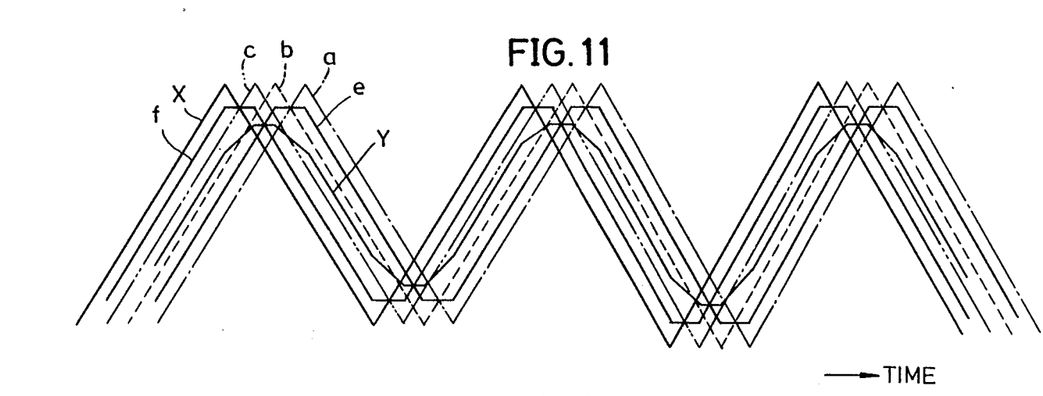
FIG. 11 shows waveforms at different parts of the configuration shown in FIGS. 9 and 10.

FIG. 9 is a block diagram of a filter circuit, which is an example of an application for the configuration shown in FIGS. 5 and 6. In FIG. 9, the same reference numerals as those in the previous figures represent the same elements as those therein. Delay circuits 33, 34 and 35 each have the same structure as that shown in FIGS. 5 and 6. The delay circuits 33, 34 and 35 have different delay amounts $d_x$, $d_y$ and $d_z$, respectively. In other words, the delay circuits have their own constant values $\alpha_i$ corresponding to the delay amounts. Different constant values $\alpha_i$ are easily obtainable by changing the combination of high-level inputs and low-level inputs in the constant value generating circuit 23 in each delay circuit. The delay circuits 33, 34 and 35 receive an input signal X applied at an input terminal to be filtered. The input signal X and output signals of the delay circuits 33, 34 and 35 are supplied to a calculating circuit 36. In detail, as shown in FIG. 11, the input signal X is delayed by the delay time $d_x$ by the delay circuit 33 and is fed as a signal a to the calculation circuit 36. Similarly, the input signal X is delayed by the delay times $d_y$ and $d_z$ by the delay circuits 34 and 35, respectively. Then, as shown in FIG. 11, delayed signals b and c from the delay circuits 34 and 35, respectively, are supplied to the calculating circuit 36.

Figure 10:
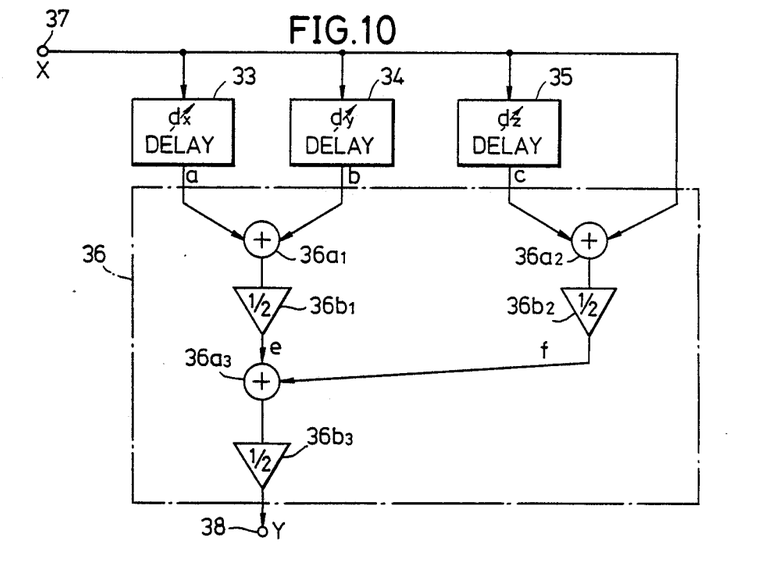
FIG. 10 is a circuit diagram of a calculating circuit shown in FIG. 9.

FIG. 10 is a circuit diagram of the calculating circuit 36 shown in FIG. 9. The signals a and b are applied to an adder $36a_1$, an output of which is supplied to a ½ level attenuator $36b_1$. An output signal e of the attenuator $36b_1$ is shown in FIG. 11. On the other hand, the signal c and the input signal X are supplied to an adder $36a_2$, an output of which is applied to a ½ level attenuator $36b_2$. An output signal f of the attenuator $36b_2$ is also shown in FIG. 11. The signals e and f are provided to an adder $36a_3$, an output of which is fed to a ½ attenuator $36b_3$. An output signal Y of the attenuator $36b_3$ is illustrated in FIG. 11. This output signal Y is outputted through an output terminal 38.

A triangle wave signal includes odd harmonic components as expressed by the following equation:

$$X(t) = A_1 \cdot \cos \omega_0 t + A_3 \cdot \cos 3\omega_0 t + A_5 \cdot \cos 5\omega_0 t + $$

As shown in FIG. 11, the output signal Y is a substantially sinusoidal waveform. This means that the above odd harmonic components have been eliminated. In this case, the delay times of the delay circuits 33, 34 and 35 are varied in response to the frequency of the input signal X, and therefore the frequencies of the signal to be filtered follow up the frequency of the input signal X. As a result, the output signal having a frequency characteristic corresponding to that of the input signal X is obtainable.

A description will be given of another embodiment of a signal processing circuit according to the present invention.

Figure 12:
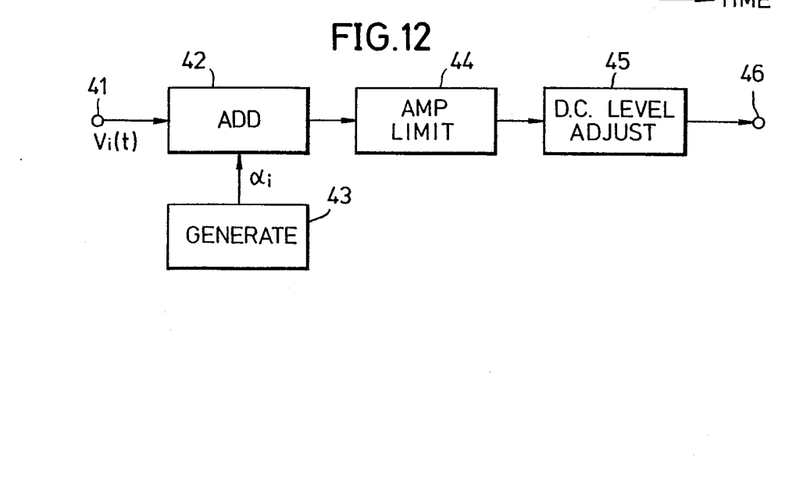
FIG. 12 is a block diagram of another embodiment of a signal processing circuit according to the present invention.

FIG. 12 is a block diagram of this embodiment. As described before, the signal processing circuit shown in FIG. 5 has only the delay function for the input signal. On the other hand, the configuration shown in FIG. 12 has not only the delay function but also a filtering function.

In FIG. 12, a constant value generating circuit 43 generates a constant value $\alpha_i$ corresponding to a predetermined delay amount $d_i$. An adding circuit 42 adds the constant value $\alpha_i$ to an input signal $V_i(t)$ passed through an input terminal 41, for every period which is half of a period of the input signal. An amplitude limiting circuit 44 amplitude-limits that output signal of the adding circuit 42 at a level below a maximum level of the output signal by a predetermined level as well as at a level over a minimum level thereof by a predetermined level. A direct current (D.C.) level adjusting circuit 45 decreases a D.C. level of an output signal of the amplitude limiting circuit 44, so that the output signal has a D.C. level the same as that of the input signal.

Figure 13:
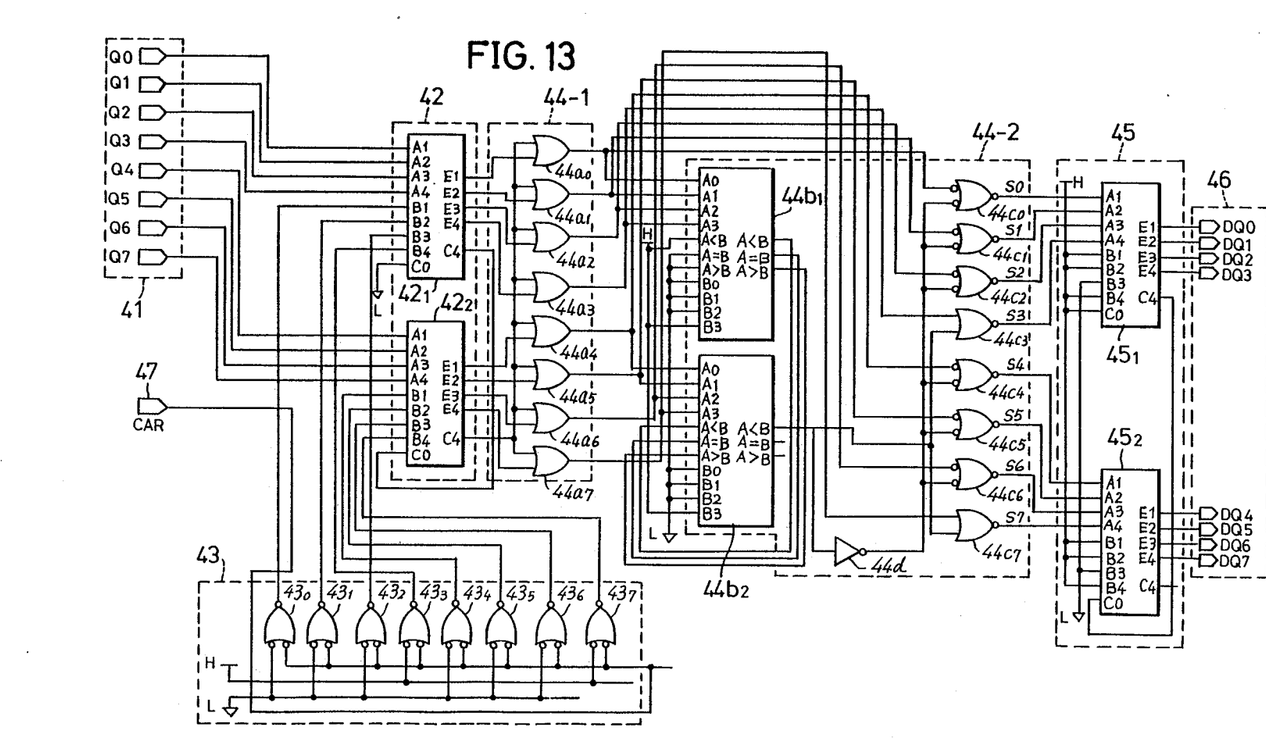
FIG. 13 is a circuit diagram of the configuration shown in FIG. 12.

FIG. 13 is a circuit diagram of the configuration shown in FIG. 12, and FIG. 14(A) through (E) are waveforms at different parts of the circuit shown in FIG. 13. The input signal $V_i(t)$ composed of 8 bits Q0, Q1, ..., Q7 are passed through the input terminal 41 and are then fed to the adding circuit 42. In this example, the input signal $V_i(t)$ is a triangular wave signal shown in FIG. 14(B).

The adding circuit 42 includes 4-bit binary full adders $42_1$ and $42_2$ (74-283 type, for example). The binary signals Q0–Q3 are applied to input terminals A1–A4 of the adder $42_1$, respectively, and the signals Q4–Q7 are applied to input terminals A1–A4 of the adder $42_2$, respectively. Input terminals B0–B3 of the adders $42_1$ and $42_2$ receive the constant value $\alpha_i$ derived from the constant value generating circuit 43.

Figure 14:
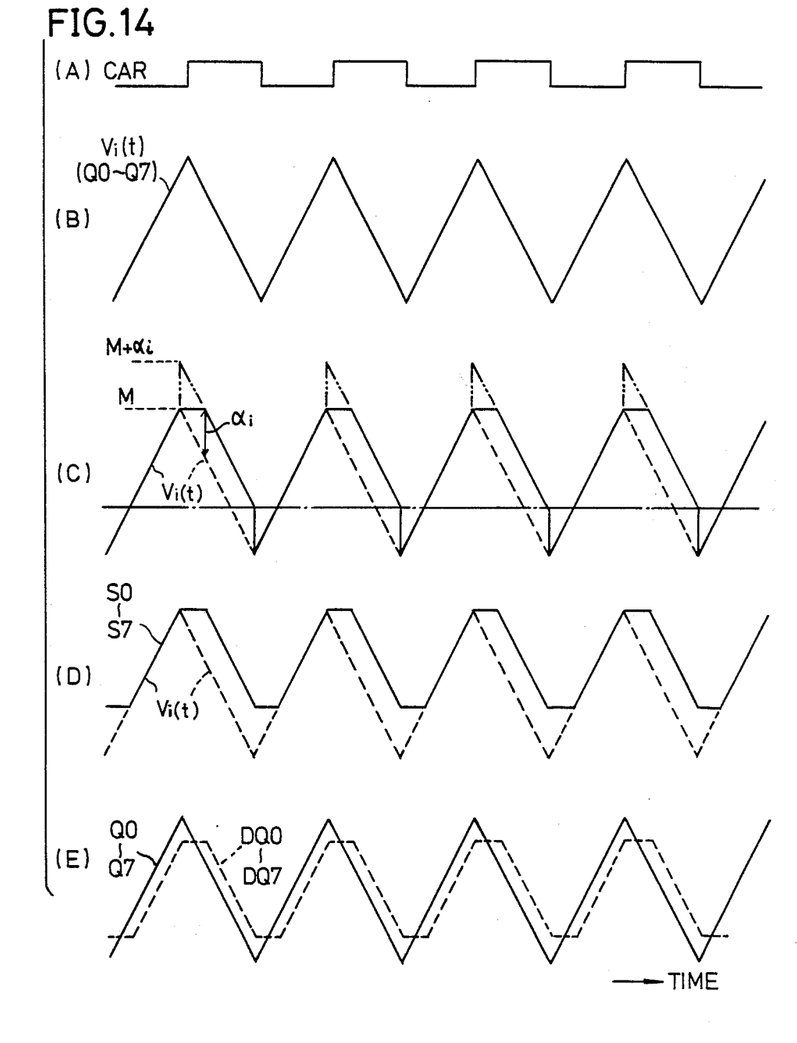

The constant value generating circuit 43 consists of low-active OR circuits $43_0$–$43_7$. Each OR circuit is provided with a high-level signal or a low-level signal corresponding to the constant value $\alpha_i$ to be applied to the adding circuit 42. The OR circuits also receive a timing signal CAR shown in FIG. 14(B) through a terminal 47. The timing signal CAR has a period half of the period of the input signal. Therefore, the constant value $\alpha_i$ is produced only when the timing signal CAR is at the high level. The output of the OR circuits $43_0$–$43_3$ are supplied to input terminals B1–B4 of the adder $42_1$, respectively, and the outputs of the OR circuits $43_4$–$43_7$ are supplied to input terminals B1–B4 of the adder $42_2$, respectively.

A low-level signal is always applied to a carry input terminal of the adder $42_1$. The adder $42_1$ adds signals between A-side terminals and corresponding B-side terminals and outputs added results through corresponding output terminals E1–E4. Similarly, the adder $42_2$ carries out the adding operation and outputs an adding result between A1 and B1 through output terminals E1–E4.

When the timing signal CAR is maintained at the low level, the constant value generating circuit 43 does not produce the constant value $\alpha_i$. Therefore, the adding circuit 42 outputs the binary signals Q0–Q7 without the added constant value $\alpha_i$. On the other hand, when the level of the timing signal CAR becomes high, the adding circuit 42 is initiated to add the constant value $\alpha_i$ to the input signal $V_i(t)$ composed of the binary signals Q0–Q7.

The amplitude limiting circuit 44 shown in FIG. 12 has a maximum value limiting circuit 44-1 and a minimum value limiting circuit 44-2, as shown in FIG. 13. The maximum value limiting circuit 44-1 is composed of 8 OR circuits $44a_0$–$44a_7$. The OR circuits $44a_0$–$44a_3$ receive output signals from the terminals E1–E4 of the adder $42_1$, respectively and the OR circuits $44a_4$–$44a_7$ receive output signals from the terminals E1–E4 of the adder $42_2$, respectively. Further, all the OR circuits $44a_0$–$44a_7$ receive the carry output of the adder $42_2$.

When the output of the adding circuit 42 exceeds its maximum value M (255 in the decimal notation) because of the addition of the constant value $\alpha_i$, the carry is outputted through the terminals C4 of the adder $42_2$. Therefore, all the outputs of the OR circuits $44a_0$–$44a_7$ are set to the high level. Thereafter, the value provided by the outputs E1–E4 of the adders $42_1$ and $42_2$ and the carry output C4 of the adder $42_2$ varies as shown by two-dotted chain lines in FIG. 14(C). However, the output of each of the OR circuits $44a_0$–$44a_7$ is fixed at the high level during the interval when the carry is outputted. In other words, the level of the output signal of the maximum value limiting circuit 44-1 is maintained at the maximum value M, as shown in FIG. 14(C), so long as the outputs of the adders $42_1$ and $42_2$ correspond to the value indicated by the two-dotted chain lines.

All the outputs of the maximum value limiting circuits 44-1 are supplied to the minimum value limiting circuit 44-2. This circuit 44-2 includes magnitude comparators $44b_1$ and $44b_2$ (74-85 type, for example), low-active OR circuits $44c_0$–$44c_2$ and $44c_4$–$44c_6$, OR circuits $44c_3$ and $44c_7$, and an inverter $44d$, as shown in FIG. 13. The outputs of the OR circuits $44a_0$–$44a_3$ are fed to input terminals A0–A3 of the comparator $44b_1$, and the outputs of the OR circuits $44a_4$–$44a_7$ are supplied to input terminals A0–A3 of the comparator $44b_2$. Input terminals B0–B3 of the comparators $44b_1$ and $44b_2$ are provided with binary signals corresponding to a reference level $L_{ref}$ shown by a dotted chain line in FIG. 14(C). In this example, as shown in FIG. 13, the low-level signal is applied to the terminals B0–B2 of the comparators $44b_1$ and $44b_2$, and the high-level signal is applied to the terminals B3 thereof. Each of the comparators $44b_1$ and $44_2$ compares the A-terminal side signals with the B-terminal side signals, and outputs a compared results through corresponding terminals of terminals A<B, A=B and A>B. In the configuration illustrated in FIG. 13, only the comparison A<B is enabled, because an input terminal regarding the comparison A<B receives the high-level signal. As a result, when the output signal of the maximum value limiting circuit 44-1 becomes smaller than the reference level $L_{ref}$, the high-level signal is outputted through an output terminal A<B of the comparator $44b_2$.

The binary outputs of the OR circuits $44a_0$–$44a_7$ are also supplied to the OR circuits $44c_0$–$44c_7$, respectively. The signal from the terminal A<B of the comparator $44b_2$ is delivered to the OR circuits $44c_3$ and $44c_7$, and further inverted by an inverter $44d$ and supplied to the OR circuits $44c_0$–$44c_2$, and $44c_4$–$44c_6$. As a result, when the output signal of the maximum value limiting circuit 44-1 is below the reference level $L_{ref}$, the OR circuits $44c_0$–$44c_7$ produce signals corresponding to the reference level $L_{ref}$. Of course, in other cases A>B and A=B, the binary signals from the maximum value limiting circuit 44-1 are passed through the corresponding OR circuits of the minimum value limiting circuit 44-2. The output signal of the amplitude limiting circuit 44 is outputted as signals S0–S7 as shown by a solid line in FIG. 14(C).

The output signals of the amplitude limiting circuit 44 is supplied to the D.C. level adjusting circuit 45. This circuit 45 consists of two 4-bit binary full adders $45_1$ and $45_2$ (74-283 type, for example). The binary signals S0–S3 are fed to input terminals A1–A4 of the adder $45_1$, and the signals S4–S7 are fed to input terminals A1–A4 of the adder $45_2$. Input terminals B1–B4 of the adders $45_1$ and $45_2$ are provided with binary signals corresponding to a D.C. level to be shifted towards a lower-level direction. In this illustrated example illustrated, the input terminals B1, B2 and B4 of the adders $45_1$ and $45_2$ are provided with the high-level signal, whereas the input terminals B3 thereof are provided with the low-level signal. Since the low-level signal is applied to the carry input terminal C0, the adders act as a subtractor. As a result, binary signals DQ0–DQ7 indicated by a broken line in FIG. 14(E) are outputted through the output terminals 46. It should be noted that the waveform of the output signal shown in FIG. 14(E) is substantially the same as those in FIGS. 2 and 3.

According to the embodiment shown in FIGS. 12 and 13, the delay time of the output signals DQ0–DQ7 with respect to the input signals Q0–Q7 correspond to the constant value $\alpha_i$. Therefore, it is possible to obtain a desired delay time by suitably selecting the constant value $\alpha_i$. Further, when the constant value $\alpha_i$ is fixed, the delay time of the output signals varies as a function of the frequency of the input signal. Therefore, the frequency of the signal to be eliminated follows up the frequency of the input signals. As a result, it is possible to obtain the output signal having the frequency characteristic corresponding to the frequency characteristic of the input signal. These features are the same as those of the configuration shown in FIGS. 5 and 6. In addition, the embodiment shown in FIGS. 12 and 13 has an advantage that it has a filtering function for the input signal. The output signal provided by this embodiment (FIG. 14(E)) has the waveform substantially identical to the waveforms shown in FIGS. 2 and 3.

A description will be given of a filter which employs the filter shown in FIGS. 12 and 13.

Figure 15:
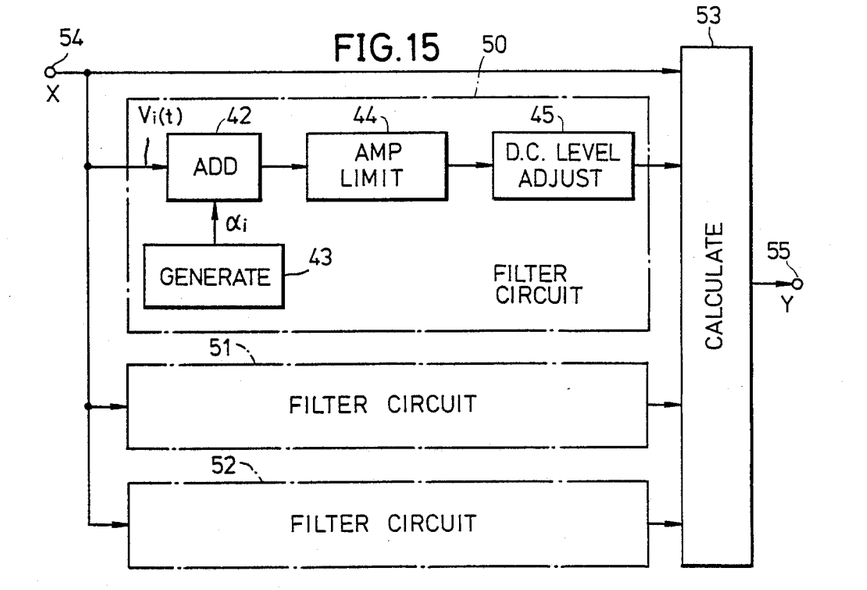
FIG. 15 is a block diagram of a filter employing a plurality of filter circuits each having the same configuration as that shown in FIGS. 12 and 13.

FIG. 15 is a block diagram of this filter. The illustrated filter includes three filter circuits 50, 51 and 52, each of which is the same as the filter shown in FIGS. 12 and 13. The filter circuits 50, 51 and 52 have different frequencies from each other. The filter circuits 50, 51 and 52 have delay times $\frac{1}{2}(d_x+1)$, $\frac{1}{2}(d_y+1)$ and $\frac{1}{2}(d_z+1)$, respectively. These delay times vary with the frequency of an input signal X for the filter, when the constant value $\alpha_i$ is fixed. Of course, the delay times vary by adjusting the constant value $\alpha_i$. Output signals a, b and c of the filter circuits 50, 51 and 52 respectively, are supplied to a calculating circuit 53 together with the input signal X.

Figure 16:
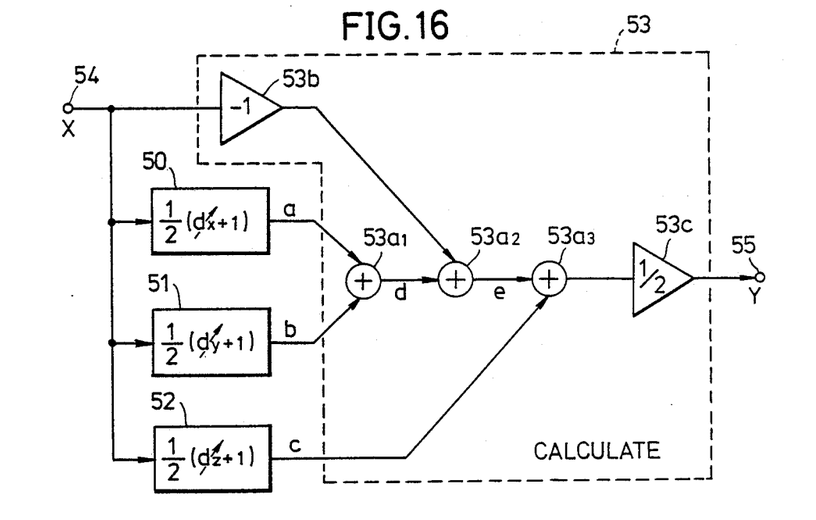
FIG. 16 is a circuit diagram of the configuration shown in FIG. 15.
Figure 17:
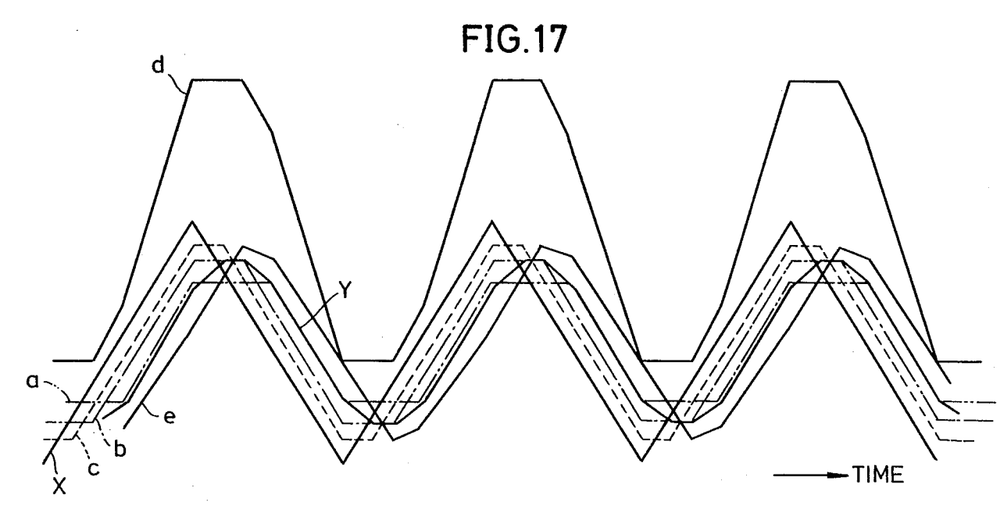
FIG. 17 shows waveforms for explaining a filtering function of the structure shown in FIGS. 15 and 16.

A detailed circuit structure of the calculating circuit 53 is shown in FIG. 16. The output signals a and b are fed to an adder $53a_1$, which outputs an added result d. These signals are shown in FIG. 17. The signal d is added to a signal passed through an inverter $53b$ by an adder $53a_2$, which outputs an added result e. This signal e is added to the output c of the filter circuit 52 by an adder $53a_3$, which outputs an added result. This result is attenuated by a $\frac{1}{2}$ level by a level attenuator $53c$ and applied as an output signal Y to an output terminal 55. As apparent from FIG. 17, the output signal Y is a substantially sinusoidal waveform. This means that odd harmonic components have been eliminated from the input triangular wave signal X.

The present invention is not limited to the embodiments, but various variations and modifications may be made without departing from the scope of the present invention. The number of the delay circuits shown in FIG. 9 is not limited to three. Similarly, the number of the filter circuits is not limited to three. Further, the number of bits to be processed is not limited to 8 bits.

What is claimed is:

1. A signal processing circuit comprising:
constant value generating means for generating a constant value ($\alpha_i$) corresponding to a delay time ($d_i$) for an input signal ($V_i(t)$);
adding/subtracting means for alternately adding the constant value to the input signal and subtracting the constant value from the input signal for every half period of the input signal; and
amplitude correcting means for correcting an amplitude of an output signal of the adding/subtracting means for every half period of the input signal so that a delayed output signal ($V_o(t)$) having a waveform corresponding to a waveform of the input signal is produced.

2. A signal processing circuit as claimed in claim 1, wherein the amplitude correcting means corrects the amplitude during an interval corresponding to the delay time ($d_i$).

3. A signal processing circuit as claimed in claim 1, wherein the amplitude correcting means comprises logic means for passing the output signal of the adding- /subtracting means and producing maximum and minimum levels of the output signal of the adding/subtracting means, and adding means for alternately adding the maximum and minimum levels to the output signal of the adding/subtracting means.

4. A signal processing circuit as claimed in claim 3, wherein the logic means comprises OR circuits and low-active OR circuits each receiving the output signal of the adding/subtracting means and a timing signal for determining the interval corresponding to the delay time, and exclusive-OR circuits receiving outputs of the low-active OR circuits and the timing signal, and wherein outputs of the OR circuits and outputs of the exclusive-OR circuits are supplied to the adding means.

5. A signal processing circuit as claimed in claim 1, wherein the constant value generating means comprises exclusive-OR circuits to which a high-level signal or a low-level signal is applied to produce the constant value.

6. A signal processing circuit as claimed in claim 1, said signal processing circuit further comprises an amplitude adjusting means for setting a level of the signal from the amplitude correcting means in the vicinity of its maximum amplitude level and minimum amplitude level to the predetermined maximum and minimum levels, respectively.

7. A signal processing circuit as claimed in claim 6, wherein the amplitude adjusting means comprises first low-active OR circuits receiving the signal of the amplitude correcting means and a timing signal (UF) for designating a timing at which the signal from the amplitude correcting means is fixed to the minimum amplitude level, and wherein the amplitude adjusting means further comprises second low-active OR circuits receiving outputs of the first low-active OR circuits and a timing signal (OF) for designating a timing at which the signal from the amplitude correcting means is fixed to the maximum amplitude level.

8. A signal processing circuit as claimed in claim 1, wherein the input signal is a triangular wave signal.

9. A signal processing circuit comprising:
a plurality of delay circuits connected in parallel, each delay circuit comprising constant value generating means for generating a constant value ($a_i$) corresponding to a delay time ($d_i$) for an input signal ($V_i(t)$); adding/subtracting means for alternately adding the constant value to the input signal and subtracting the constant value from the input signal for every half period of the input signal; and amplitude correcting means for correcting an amplitude of an output signal of the adding/subtracting means for every half period of the input signal so that a delayed output signal ($V_o(t)$) having a waveform corresponding to a waveform of the input signal is produced; and
calculating means for performing a predetermined calculation for output signals from the delay circuits and the input signal ($V_i(t)$) and extracting a signal having predetermined frequency components from the input signal.

10. A signal processing circuit comprising:
constant value generating means for generating a constant value ($a_i$) corresponding to a delay time ($d_i$) for an input signal ($V_i(t)$);
adding means for adding the constant value to the input signal for every half period of the input signal;
amplitude limiting means for limiting the level of an output signal of the adding means at a maximum level thereof and at a level larger than a minimum level thereof by a predetermined value; and
a direct current level adjusting means for decreasing a direct current level of an output signal of the amplitude limiting means by a predetermined direct current value, so that the direct current level of the amplitude limiting means become equal to that of the input signal ($V_i(t)$).

11. A signal processing circuit as claimed in claim 10, wherein the amplitude limiting means comprises OR circuits receiving the output signal of the adding means and a carry signal of the adding means, and wherein the carry signal is produced when the adding means outputs a value exceeding the maximum level.

12. A signal processing circuit as claimed in claim 11, wherein the amplitude limiting means further comprises comparing means for comparing an output signal of the OR circuits with a predetermined level, and logic means for producing said level larger than the minimum level when the output signal of the OR circuits is smaller than the minimum level.

13. A signal processing circuit as claimed in claim 10, wherein the direct current level adjusting means comprises a subtractor for subtracting a predetermined direct current level from an output signal of the amplitude limiting means.

14. A signal processing circuit as claimed in claim 10, wherein the constant value generating means comprises low-active OR circuits each receiving a high-level signal or a low-level signal corresponding to the constant value.

15. A signal processing circuit as claimed in claim 10, wherein the input signal is a triangular wave signal.

16. A signal processing circuit comprising:
a plurality of signal filtering circuits, each filtering circuit comprising constant value generating means for generating a constant value ($a_i$) corresponding to a delay time ($d_i$) for an input signal ($V_i(t)$); adding means for adding the constant value to the input signal for every half period of the input signal; amplitude limiting means for limiting the level of an output signal of the adding means at a maximum level thereof and at a level larger than a minimum level thereof by a predetermined value; and direct current level adjusting means for decreasing a direct current level of an output signal of the amplitude limiting means by a predetermined direct current value, so that the direct current level of the amplitude limiting means becomes equal to that of the input signal ($V_i(t)$); and
calculating means for performing a predetermined calculation for output signals of the direct current adjusting means and the input signal, and producing a signal having predetermined frequency components.

* * * * *